United States Patent
Han et al.

(10) Patent No.: US 9,208,083 B2
(45) Date of Patent: Dec. 8, 2015

(54) SYSTEM AND METHOD TO INTERLEAVE MEMORY

(71) Applicant: LSI Corporation, San Jose, CA (US)

(72) Inventors: Yang Han, Sunnyvale, CA (US); Zongwang Li, Dublin, CA (US); Shaohua Yang, San Jose, CA (US); Kaichi Zhang, Fremont, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 196 days.

(21) Appl. No.: 14/169,424

(22) Filed: Jan. 31, 2014

(65) Prior Publication Data

US 2015/0154114 A1    Jun. 4, 2015

Related U.S. Application Data

(60) Provisional application No. 61/911,699, filed on Dec. 4, 2013.

(51) Int. Cl.
*G06F 12/00* (2006.01)
*G06F 12/06* (2006.01)

(52) U.S. Cl.
CPC .................................. *G06F 12/0607* (2013.01)

(58) Field of Classification Search
None
See application file for complete search history.

(56) References Cited

U.S. PATENT DOCUMENTS

| | | | |
|---|---|---|---|
| 6,661,591 B1 | 12/2003 | Rothberg | |
| 8,099,561 B2 * | 1/2012 | Bayer | G06F 13/4243 710/38 |
| 8,295,250 B2 | 10/2012 | Gorokhov et al. | |
| 8,327,092 B2 | 12/2012 | Borracini et al. | |
| 8,397,123 B2 | 3/2013 | Pan et al. | |
| 8,427,874 B2 | 4/2013 | Kato | |
| 8,464,009 B2 | 6/2013 | Sivaramakrishnan et al. | |
| 2011/0125975 A1 * | 5/2011 | Kim | G06F 12/0607 711/157 |
| 2012/0307545 A1 | 12/2012 | McAdams et al. | |
| 2013/0139023 A1 | 5/2013 | Han et al. | |
| 2013/0173874 A1 | 7/2013 | Sprouse et al. | |
| 2013/0242658 A1 | 9/2013 | Moshayedi et al. | |
| 2013/0294162 A1 | 11/2013 | Liu et al. | |

\* cited by examiner

*Primary Examiner* — Brian Peugh

(57) ABSTRACT

A memory interleaving apparatus includes first and second interleavers. The first interleaver selectively interleaves information stored in a first memory in response to a sector select signal. The second interleaver selectively interleaves information stored in a second memory in response the sector select signal. The first interleaver is coupled with the second interleaver. A memory interleaving system includes an interleaver and a storage device. The interleaver is associated with a first sector size and a second sector size. The interleaver selectively interleaves information stored in a first memory and/or a second memory in response to a sector select signal. The storage device selectively provides the first masking seed and/or a second masking seed to the interleaver in response to the sector select signal. Corresponding methods are also disclosed.

23 Claims, 10 Drawing Sheets

FIG. 3

| OPTION | REMOVAL | ADDITION | ROM (PER 96 SYMBOLS) | THROUGHPUT | LATENCY | PERFORMANCE IMPACT |
|---|---|---|---|---|---|---|
| POR | | | 4KB: 32X2<br>512B: 64 | | | |
| I (IMPACTS 512B) | ONE 96x96 LOCAL ITLV | ONE EXTRA STAGE OF 96x96 SWITCHING (FOR 512B) | 4KB: 32x2<br>512B: 32x2+64 (INCREASE ROM SIZE) | SAME | SAME | SOME DEGRADATION ON 512B DUE TO REDUCED PERMUTATION FREEDOM |
| II (IMPACTS 4KB) | TWO 48x48 LOCAL ITLV | DIFFERENT MASKING SEEDS FOR 4KB AND 512B | 4KB: 64<br>512B: 64 | SAME | SAME (ONE MORE STAGE FOR 4KB ON NON-CRITICAL PATH) | THEORETICALLY NONE |

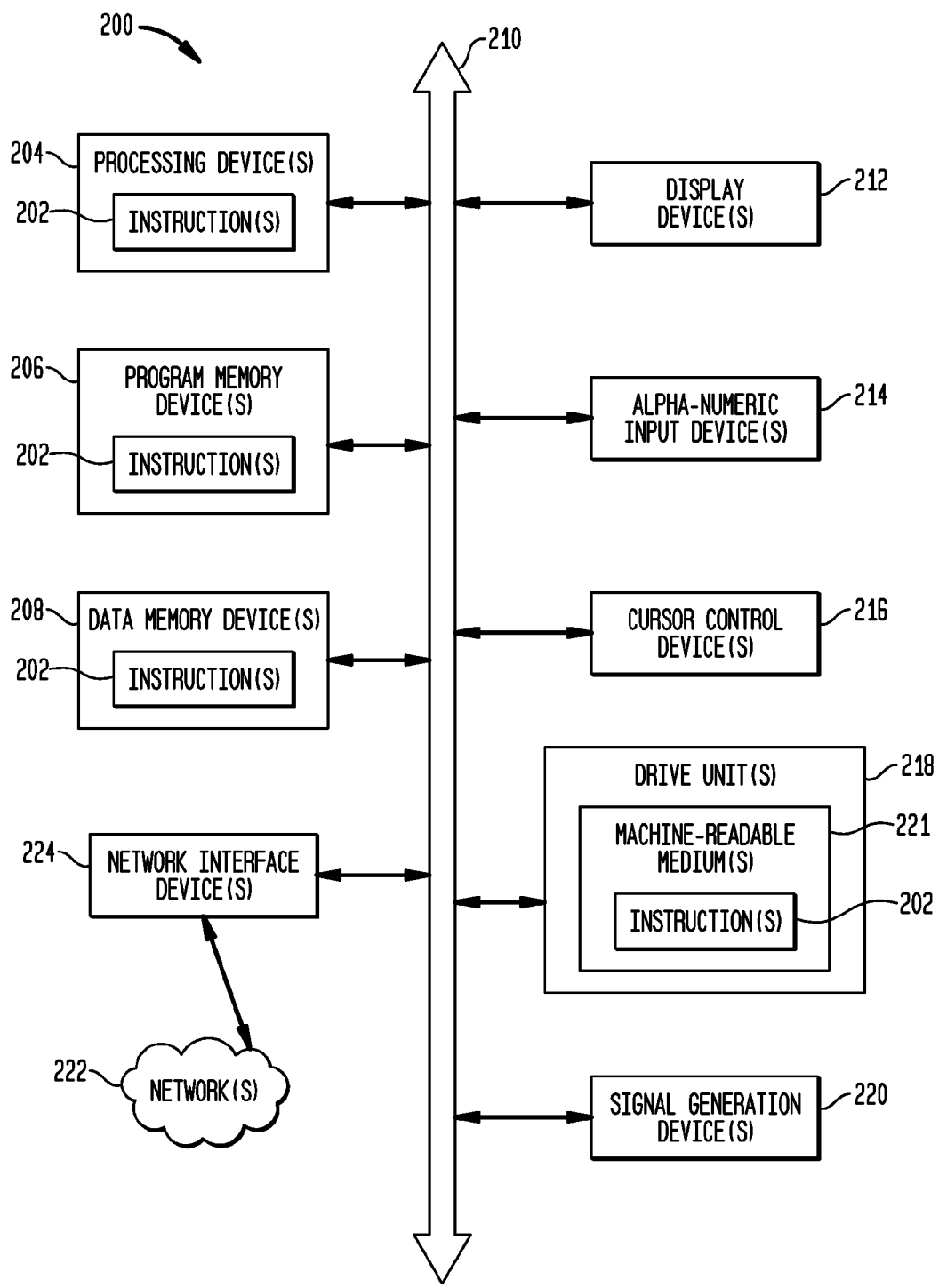

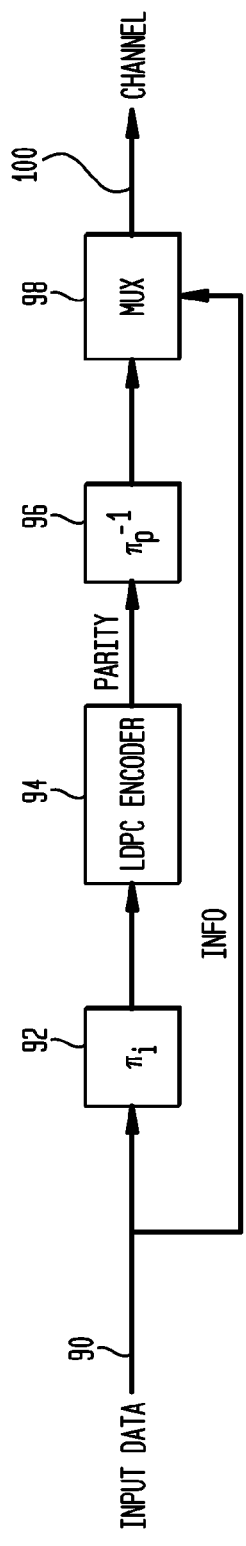
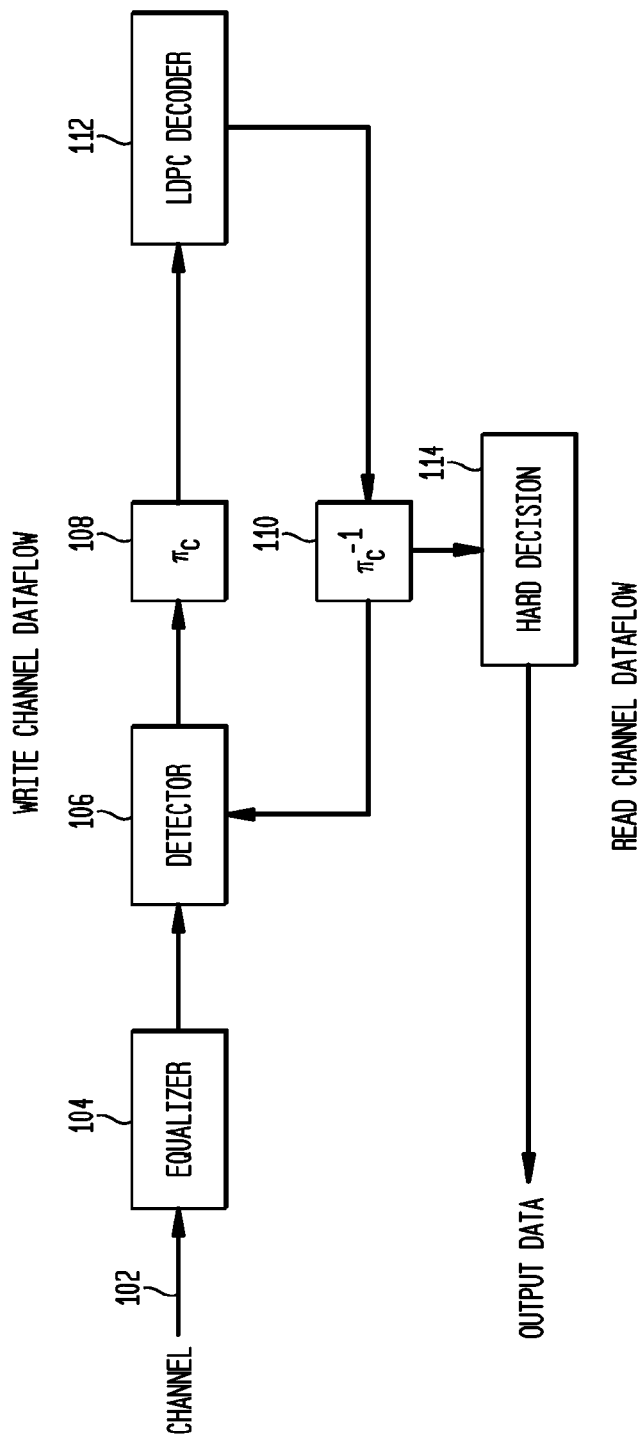

SYSTEM AND METHOD TO INTERLEAVE MEMORY

CROSS-REFERENCE TO RELATED APPLICATION(S)

This application claims the benefit of priority from U.S. Provisional Application No. 61/911,699, filed Dec. 4, 2013, the disclosure of which is incorporated herein by reference in its entirety.

TECHNICAL FIELD

The present invention generally relates to electrical and electronic circuitry and, more particularly, relates to hard disk drive (HDD) read channel read path and write path interleaving.

BACKGROUND

Turbo equalization is a technique used with data transmission over channels with intersymbol interference (ISI), such as magnetic recording channels. Systems employing turbo equalization often utilize a special permutation of code symbols, which is performed by an interleaver, to improve the performance of forward error correcting (FEC) codes used by these systems. Most decoders for FEC codes work best under the assumption of a uniform distribution of errors. However, in magnetic recording channels, errors typically occur in bursts rather than uniformly due primarily to error events introduced by an equalizer between neighboring symbols. The interleaver permutes codeword symbols in an attempt to create a more uniform distribution of errors.

SUMMARY

In accordance with an embodiment of the invention, a memory interleaving apparatus includes a first interleaver and a second interleaver. The first interleaver is associated with a first sector size and selectively interleaves information stored in a first memory in response to a sector select signal. The first memory is associated with the first sector size. The second interleaver is associated with a second sector size and selectively interleaves information stored in a second memory in response the sector select signal. The second memory is associated with the second sector size. The first interleaver is coupled with the second interleaver. Other embodiments of the invention include, but are not limited to, being manifest as a memory interleaving system, a method of interleaving memory, and an integrated circuit. Additional and/or other embodiments of the invention are described in the following written description, including the claims, which is to be read in connection with the accompanying drawings.

BRIEF DESCRIPTION OF THE DRAWINGS

The following drawings are presented by way of example only and without limitation, wherein like reference numerals (when used) indicate corresponding elements throughout the several views, and wherein:

FIG. 3 is a table showing a comparison of parameters in accordance with the illustrative embodiments shown in FIGS. 1A-1C;

FIG. 8 is a block diagram showing at least a portion of an exemplary machine in the form of a computing system that performs methods according to one or more embodiments of the invention; and FIGS. 9A-9B are block diagrams depicting an exemplary interleaving process associated with a write channel and a read channel, respectively, in which one or more embodiments of the invention are implemented.

Figure 1A:
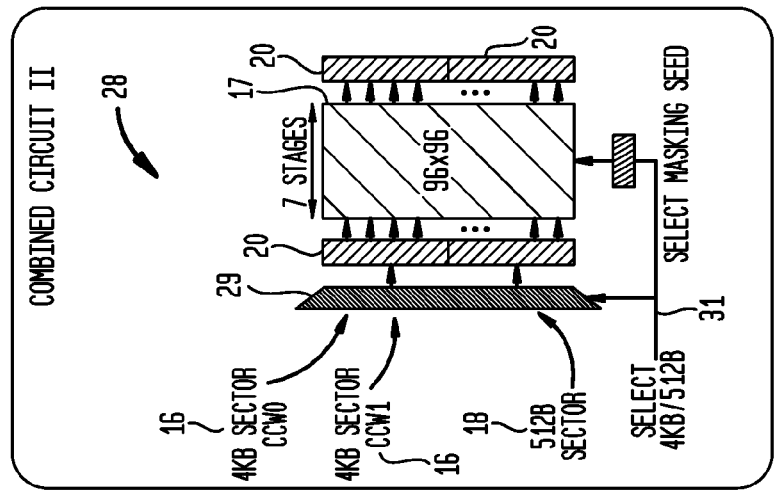
FIG. 1A is a block diagram of an illustrative interleaver circuit supporting different sector formats in a read channel.

It is to be appreciated that the drawings described herein are presented for illustrative purposes only. Moreover, common but well-understood elements and/or features that may be useful or necessary in a commercially feasible embodiment may not be shown in order to facilitate a less hindered view of the illustrated embodiments.

DETAILED DESCRIPTION

Embodiments of the invention are described herein in the context of illustrative interleaver circuits suitable for use, for example, with magnetic recording channels. It should be understood, however, that embodiments of the invention are not limited to these or any other particular embodiments, nor are they limited to use solely with magnetic recording channels. Rather, embodiments of the invention are more broadly applicable to data transfer in read and write channels. In this regard, embodiments of the invention provide greater uniformity of errors in such data transfers. Moreover, it will become apparent to those skilled in the art given the teachings herein that numerous modifications can be made to the illustrative embodiments disclosed herein that are within the scope of the claimed invention. That is, no limitations with respect to the embodiments shown and described herein are intended or should be inferred.

As a preliminary matter, for purposes of clarifying and describing embodiments disclosed herein, the following table provides a summary of certain acronyms and their corresponding definitions, as the terms are used herein:

Table of Acronym Definitions

| Acronym | Definition |
| --- | --- |
| RAM | random access memory |
| ROM | read-only memory |
| CPU | central processing unit |
| ASIC | application-specific integrated circuit |
| ISI | intersymbol interference |
| FEC | forward error correcting/correction |
| HDD | hard disk drive |
| ECC | error correcting/correction code |
| LDPC | low-density parity check |
| CRT | cathode ray tube |
| LCD | liquid crystal display |
| PE | processing element |
| POR | point of reference |
| LBA | logical block addressing |
| RAID | redundant array of independent disks |
| CHS | cylinder head sector |
| SPT | sectors per track |
| HPC | heads per cylinder |

The embodiments disclosed herein are used in connection with hard disk drive (HDD) read channel read path and write path interleaving for use in various applications, such as, but not limited to, processing algorithms, digital signal processing, coding, and the like. FIG. 9A shows an exemplary write path, in which user data to be written to the HDD is processed by logic and circuitry in the write path including interleaving and ECC encoding; FIG. 9B shows an exemplary read path.

Reading is an action performed by computers, to acquire data from a source and to store the acquired data in volatile memory for subsequent use, such as for further processing. For example, a computer may read information from a memory device and store the information in random access memory (RAM) to be placed on the HDD to be processed at some time in the future. Computers may read information from a variety of sources, such as, but not limited to, mass storage devices, the Internet, and audio and video input ports.

A read cycle generally involves the act of reading one or more units of information, such as a byte. A read channel is an electrical circuit that transforms physical magnetic flux changes, which are retrieved from a magnetic storage medium, into abstract bits, such as logical 0's and 1's representative of the information (i.e., data) stored on the magnetic storage medium. A read error occurs when the physical portion of the process fails to assign a retrieved magnetic flux change with a correct data bit. Read errors may be caused by one or more of a variety of factors, such as, dust or dirt entering the HDD.

Information is commonly stored on disk storage in very small pieces, generally referred to as sectors or blocks. These sectors are arranged in concentric rings referred to as tracks across the surface of the disk. While it may seem easiest to order these blocks in numerical order in each track, such as 1 2 3 4 5 6 7 8 9, this ordering may not yield the highest performance.

Data to be written or read is stored in a special region of reusable memory, which is referred to as a buffer. When data is to be written, the data is moved into the buffer, and then written from the buffer to the disk. When data is read, the reverse takes place, transferring first into the buffer and then moving the data to where it is needed. Many computers are not fast enough to read a sector, move the data from the buffer to somewhere else, and be ready to read the next sector by the time that next sector is under the read head.

When sectors are arranged in numerical order, after the first sector is read, the computer may need the time it takes for three sectors to pass by the read head before the computer is again ready to receive data. However, if the sectors are arranged in numerical order, sectors two, three, and four have already passed by the read head. In this case, the computer does not need sectors 4, 5, 6, 7, 8, 9, or 1, and must wait for these sectors to pass by the read head before reading the next sector, which is sector two. This waiting for the disk to spin around to the right spot reduces the overall data transfer rate.

To correct for processing delays, the ideal interleave for this system would be 1:4, which orders the sectors as the following: 1 8 6 4 2 9 7 5 3. Thus, the computer reads sector 1, processes for three sectors, whereby sectors 8, 6, and 4 pass by, and just as the computer becomes ready again, sector two is arriving as it is needed. At times, the interleave is expressed as a skip factor, which represents the number of physical sectors between consecutive logical sectors. A skip factor of 0 places the sectors in numerical order; that is, 1 2 3 4 5 6, etc. Thus, interleaving is a process or methodology that increases efficiency, speed, and reliability by arranging data in a non-contiguous manner.

However, the interleaver in accordance with embodiments disclosed herein is concerned with interleaving within a sector, rather than across sectors. One purpose of interleaving is to improve the performance of FEC in systems such as HDDs. FIG. 9A is a block diagram that illustrates an exemplary interleaving process concerning a write channel, and FIG. 9B is a block diagram that illustrates an exemplary interleaving process concerning a read channel, in which one or more embodiments disclosed herein are implemented.

In FIG. 9A, input data 90 is provided to a user data interleaver 92 followed by a low-density parity check (LDPC) encoder 94, which generates parity bits based on the input data 90. The encoded parity bits are provided to a parity bit interleaver 96 followed by a multiplexer 98, which multiplexes the interleaved parity bit from parity bit interleaver 96 with the input data 90 to the write channel 100

In FIG. 9B, the read channel 102 is coupled to an equalizer 104, which reshapes the input signal 102 in accordance with a desired response and/or target, followed by a detector 106, which is typically a Viterbi-like detector, to remove intersymbol interference (ISI) from the channel. The output of the detector 106 is coupled to a channel interleaver 108, which permutes the detector output sequence into an order that matches an LDPC encoder sequence, followed by a LDPC decoder 112, which decodes both the parity and user bits. The decoded bits are provided to a de-interleaver 110, which permutes the decoder output in LDPC encoder order back to detector order and provides its output to the detector 108 for another round of detector processing, and a hard decision block 114, which send out the detector output as a final hard decision if LDPC decoding has been successful or after a pre-programmed number of iterations between the detector and decoder are performed. The output of the hard decision block 114 is provided to the write channel.

Interleaving divides memory into smaller chunks, and is used as a high-level technique to solve memory latency issues for motherboards and chips as well. By increasing bandwidth so that data can access chunks of memory, the overall performance of the processor and system increases. This is because the processor can fetch and send more data to and from memory in the same amount of time. Interleaving is supported by many types of motherboards. Interleaving also promotes efficient database usage and communication with servers.

There are various types of interleaving. Two-way interleaving occurs when two memory blocks are accessed at the same level for reading and writing operations, which creates a potential for overlap. Four-way interleaving occurs when four memory blocks are accessed at the same time. Error-correction interleaving is used to address high-volume errors in communication systems. Interleaving controls each of these types of errors with specific algorithms.

In an illustrative read channel 10 shown in FIG. 1A, separate, dedicated interleaver circuits 12, 14 are used for a 4 kilobyte (KB) sector 16 and a 512 byte (B) sector 18. This arrangement of the read channel 10 is done for primarily two reasons. First, the 4 KB sector 16 includes two-way interleaving using two component codewords and local interleaving is performed within the component codeword. The decoding hardware complexity is determined by the size of the component codeword. To control hardware costs, a sector may include multiple component codewords. Second, to have the same throughput and/or buffer size, one 4 KB local interleaver 12 (48×48) is half the size of one 512B local interleaver 14 (96×96), and two 48×48 interleaver circuits 12 are used for the 4 KB sector 16. Thus, the 512B sector 18 includes one component codeword, while the 4 KB sector 16 includes two component codewords. Accordingly, if the same amount of data is received by the 512B sector 18, such as 96 symbols, each of the 96 symbols belongs to one component codeword. For the 4 KB sector 18, 48 symbols belong to one component codeword and 48 symbols belong to the other component codeword. Scratch pad memory is provided at the input and output of the interleaver circuits 12, 14, and the output of the scratchpad memory 20, which receives the output of the interleaver circuits 12, 14, is coupled to a multiplexer 22.

It is to be appreciated that an interleaver is often characterized according to a particular mapping or organization, m×n, where m and n are integers. Sometimes, m and n are the same, as in the case, for example, of a 48×48 or 96×96 mapped interleaver, although m and n may be different integers as well.

The embodiments disclosed herein combine the functionality of the separate interleaver circuits 12, 14, which have been used in connection with the 4 KB sector 16 and 512B sector 18, using hardware architecture modifications without degrading performance. The result is a net savings in hardware area by removing similar circuits and multiplexers. In addition, congestion associated with central memory is substantially reduced.

Although the organization (m×n) and size of the read channel disclosed herein is provided by way of example only and without limitation, the 4 KB and 512B dimensions referred to herein are sector sizes that are supported by standard read channels. For a given sector size, the system is configured to achieve a desired performance. The embodiments disclosed herein flexibly use one unified Omega network circuit to support different sector sizes and/or system requirements without incurring additional hardware costs. If the sector size is changed, parameters of the system may need revision as well. Thus, references to particular sector sizes herein are merely intended as examples without limiting the scope of the disclosure in any way. The embodiments disclosed herein are equally applicable to any sector size, with or without modification.

An Omega network, as the term is known in the art, is a multistage interconnection configuration (meaning that processing elements (PEs) are connected using multiple stages of switches) often used in parallel computing architectures. Inputs and outputs are given prescribed addresses, and the outputs from each stage are connected to the inputs of the next stage using a "perfect shuffle" connection arrangement. By way of analogy, the connections at each stage represent the movement of a deck of cards divided into two equal decks and then shuffled together, with each card from one deck alternating with the corresponding card from the other deck. In terms of binary representation of the PEs, each stage of the perfect shuffle can be thought of as a cyclic logical left shift (i.e., each bit in the address is shifted, with the most significant bit moving toward the least significant bit). The Omega network is highly blocking, though one path can always be made from any input to any output in a free network.

At each stage, adjacent pairs of inputs are connected to a simple exchange element, which can be set either straight (pass inputs directly through to outputs) or crossed (send top input to bottom output, and vice versa). For N processing elements, where N is an integer, an Omega network contains N/2 switches at each stage, and $\log_2 N$ stages. The manner in which these switches are set determines the connection paths available in the network at any given time. Two such methods are destination-tag routing and XOR-tag routing, discussed in further detail below.

In contrast with FIG. 1A, in which there is a dedicated 96×96 interleaver circuit 14 plus scratch pad memory 20 associated with the 512B sector 18, and a dedicated circuit with two 48×48 interleaver circuits 12 and scratch pad memory 20 associated with the 4 KB sector 16, embodiments disclosed herein advantageously utilize one circuit for both sector formats by removing circuitry to save hardware, routing, and multiplexing resources, thereby relieving routing congestion.

Figure 1B:
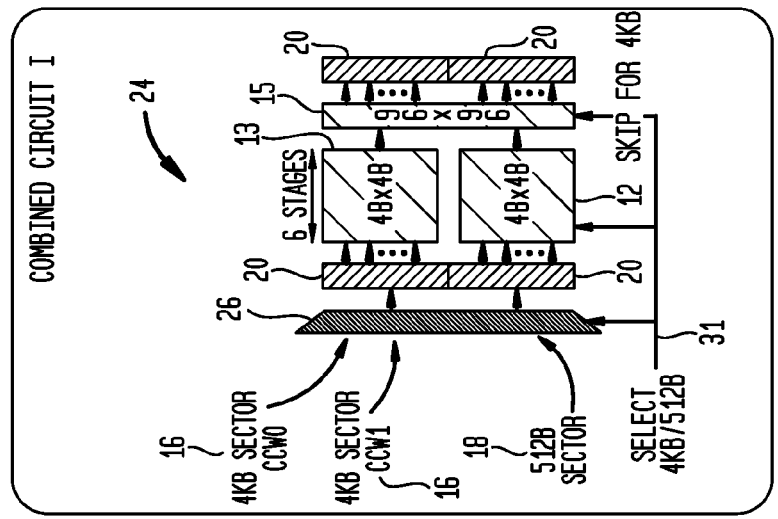
FIG. 1B is a block diagram depicting at least a portion of a first illustrative interleaver circuit, in accordance with an embodiment of the invention.

FIG. 1B is a block diagram of a first embodiment 24 in which the scratch pad memory 20 associated with the 512B sector 18 has been removed, and the 96×96 interleaver circuit 15 has been recoupled in series with and following the 48×48 interleaver circuits 13. A multiplexer 26 is coupled between the 4 KB and 512B sectors 16, 18 and the scratch pad memory 20, which is coupled to the input of the 48×48 interleaver circuit 12. The multiplexer 26 selectively provides outputs from the 4 KB sector 16 or 512B sector 18 to the scratch pad memory 20 at the input of the 48×48 interleaver circuits 13 in response to a sector select signal 31. The 96×96 interleaver circuit 15 selectively interleaves the outputs from the 48×48 interleaver circuits 13 or enables these outputs to pass through in response to the sector select signal 31. The 48×48 interleaver circuits 13 selectively interleave the outputs from the 4 KB sector 16 or enable these outputs to pass through to the 96×96 interleaver circuit 15 in response to the sector select signal 31. That is, if the channel is to be used for 4 KB sectors 16, the data will be processed by the 48×48 interleaver circuits 13, and if the channel is to be used for the 512B sector 18, the data will be processed by the 96×96 interleaver circuit 15. The multiplexer 20 is used to select an active path.

Figure 1C:
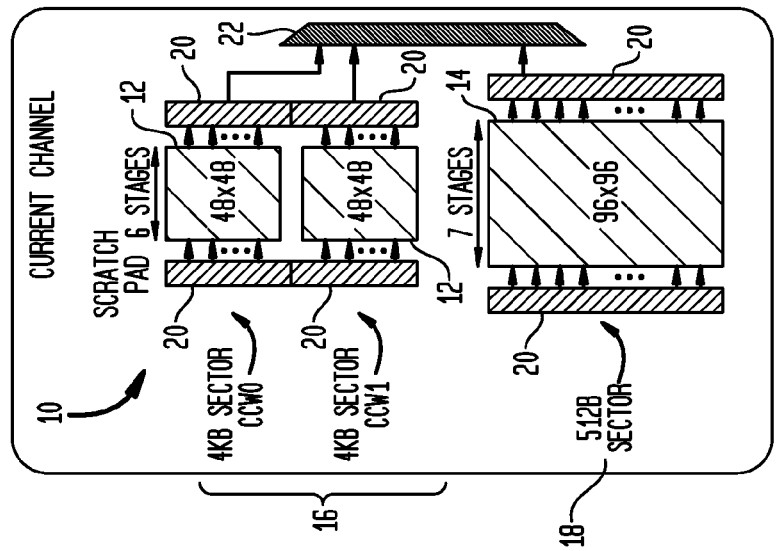
FIG. 1C is a block diagram depicting at least a portion of a second illustrative interleaver circuit, in accordance with another embodiment of the invention.

FIG. 1C is a block diagram of a second embodiment 28, in which the 48×48 interleaver circuits 12 and associated scratch pad memory 20 are removed and a multiplexer 29 is coupled between the 4 KB and 512B sectors 16, 18 and the scratch pad memory 20, which is coupled to the input of the 96×96 interleaver circuit 12. The multiplexer 29 selectively provides outputs from the 4 KB sector 16 or 512B sector 18 to the scratch pad memory 20 at the input of the 96×96 interleaver circuit 14 in response to a sector select signal 31. As described in further detail above, selection of sector format is determined by the user. Once the user chooses to use one of the sector formats, the corresponding omega network seed and seed masking shown in, for example, FIG. 7B, is loaded to the 96×96 omega network 14. Omega network control seeds and seed masking are pre-determined for each sector format, and stored in ROM or RAM.

Figure 2A:
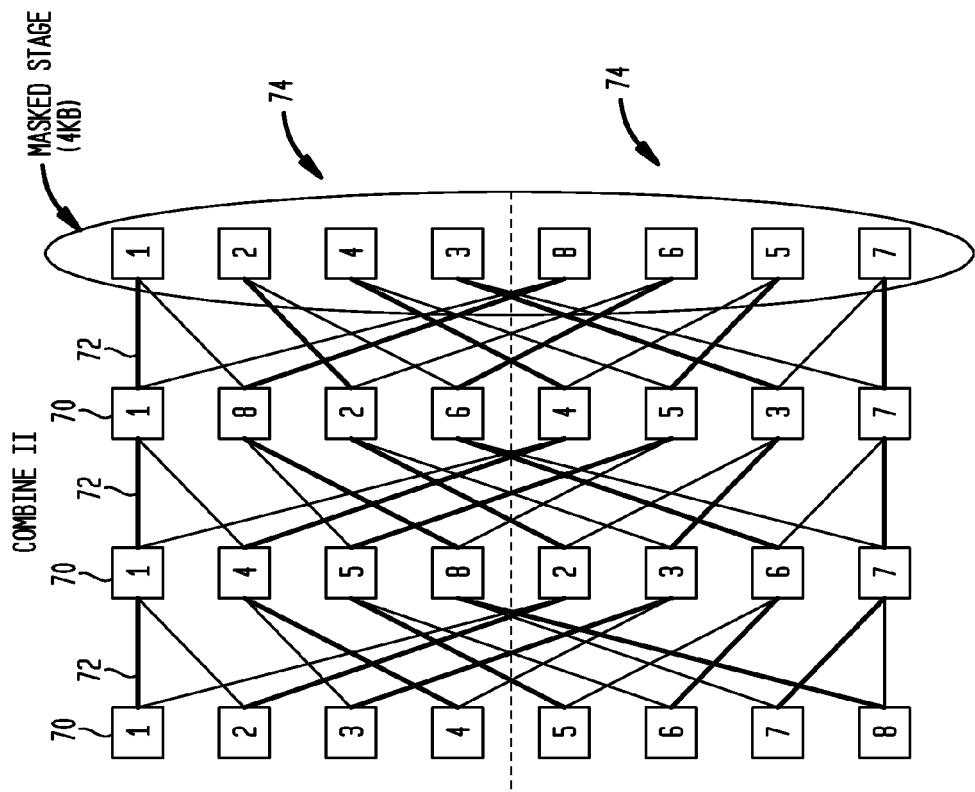
FIG. 2A conceptually depicts a first example of a mapping of processing elements in accordance with the illustrative embodiment shown in FIG. 1B.

FIG. 2A shows a mapping example of processing elements 64 in accordance with the first embodiment shown in FIG. 1B, in which two 48×48 Omega networks 12 are used to interleave the 4 KB sector 18 and 512B sector 18. In this example, two 4×4 Omega networks are used rather than two 48×48 Omega networks. Each of any two vertically adjacent processing elements 64 in FIG. 2A corresponds to one switch, which is programmed by a seed to switch on or off. The bold lines 66 represent one non-limiting example of how the switches are programmed. FIG. 2A is an illustration concerning the 512B sector 18, which uses a smaller Omega network than the 48×48 Omega network 12 shown in FIGS. 1A-1C, for example, and assumes an 8×8 mapping of processing elements 64 that is implemented using two 4×4 Omega networks 68. FIG. 2A is intended as a simplified example for illustration of certain concepts associated with the actual 48×48 Omega network shown in FIG. 1B. FIG. 1B illustrates the use of two 48×48 Omega networks to realize a 96×96 permutation, which is illustrated in FIGS. 2A-2B using two 4×4 Omega networks to realize an 8×8 permutation.

Figure 2B:
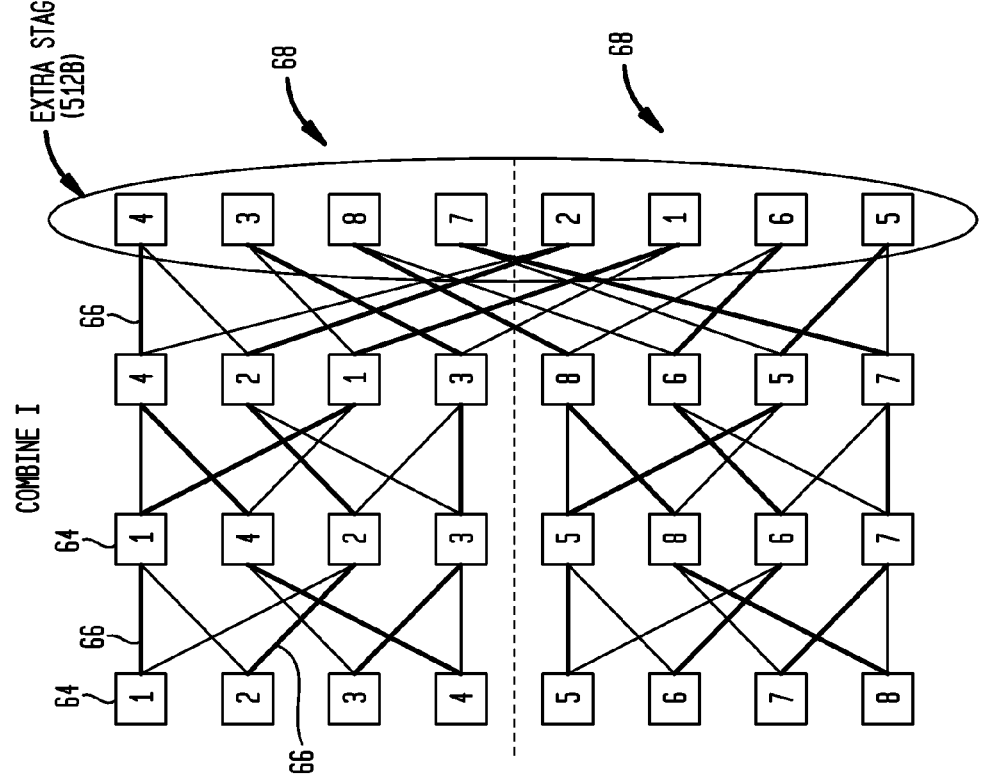
FIG. 2B conceptually depicts a second example of a mapping of processing elements in accordance with the illustrative embodiment shown in FIG. 1C.

FIG. 2B shows a mapping of processing elements 70 in accordance with the second embodiment shown in FIG. 1C, in which one 96×96 Omega network is used to support both the 512B sector 18 and the 4 KB sector 16 with some modifications as shown in FIG. 2B. FIG. 1C uses one 96×96 Omega network to support two 48×48 networks, which is illustrated by the example shown in FIG. 2B, in which one 8×8 network is used to realize two 4×4 permutations. When doing so, the last stage of the switches is masked out. That is, the switches in the masked stage cannot be programmed freely by seeds. Rather, these switches are fixed as being switched off. As in FIG. 2A, each of any two vertically adjacent processing elements 70 in FIG. 2B corresponds to one switch, which is programmed by a seed to switch on or off. The bold lines 72 represent one non-limiting example of how the switches are programmed. The example shown in FIG. 2B concerns the 4 KB sector 16, which uses a smaller Omega network that is used to realize two 4×4 mappings 74 using one 8×8 Omega network. The numbers in the boxes represent inputs. For example, assume that there is a sequence of numbers from 1 to 8 in increasing order to be interleaved and/or permuted by the Omega network. Following permutation, the sequence of numbers becomes 1-2-4-3-8-6-5-7.

FIG. 3 is a table showing a comparison between various parameters associated with the illustrative embodiments shown in FIGS. 1A-1C. The first row 30 of the table provides parameters associated with the point of reference (POR) shown in FIG. 1A and indicates that a ROM needs to store 64 bits as a seed for each 96 samples being permuted for the 4 KB sector, and to store 64 bits for each 96 samples being permuted for the 512B sector. The ROM is not explicitly shown in FIG. 1A, but is located separately inside the channel to store the seeds.

The second row 32 of the table provides parameters associated with the first embodiment shown in FIG. 1B. In this embodiment, the 96×96 interleaver circuit 14 shown in FIG. 1A is removed, an extra stage of 96×96 interleaver circuit 15 is added, the ROM size for the 512B sector is increased to 32×2+64 bits per 96 samples, and there is some degradation in performance of the 512B sector due to a reduction in permutation freedom when compared with the POR embodiment shown in FIG. 1A. The 96×96 interleaver circuit 14 differs from the 96×96 interleaver circuit 15 in that the 96×96 interleaver circuit 14 shown in FIG. 1A has 6 stages (6 columns), while the 96×96 interleaver circuit 15 shown in FIG. 1B has only one stage.

The third row 34 of the table provides parameters associated with the second embodiment shown in FIG. 1C. In this embodiment, the two 48×48 interleaver circuits are removed, different masking seeds are used for the 4 KB sector and 512B sector, the ROM size for the 4 KB sector is unchanged (64 bits), and there is no degradation in performance when compared with the POR embodiment shown in FIG. 1A. When the 4 KB sector format is selected, the last stage of the 7 stages of 96×96 network 17 is switched off regardless of what the seed stored in ROM indicates. When the 512B sector format is selected, the 96×96 network 17 operates as before, that is, switches are controlled by seeds. Thus, the second embodiment provides for an improvement in performance over the first embodiment.

Figure 4A:
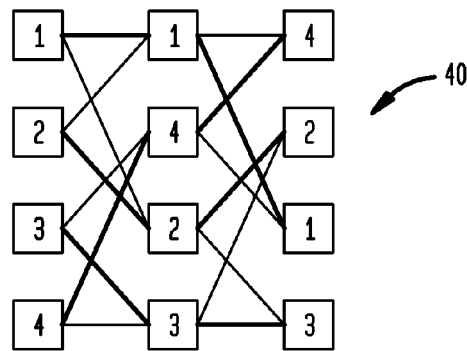
FIG. 4A is a representation of a first embodiment of an Omega network suitable for use with one or more embodiments of the invention.
Figure 4B:
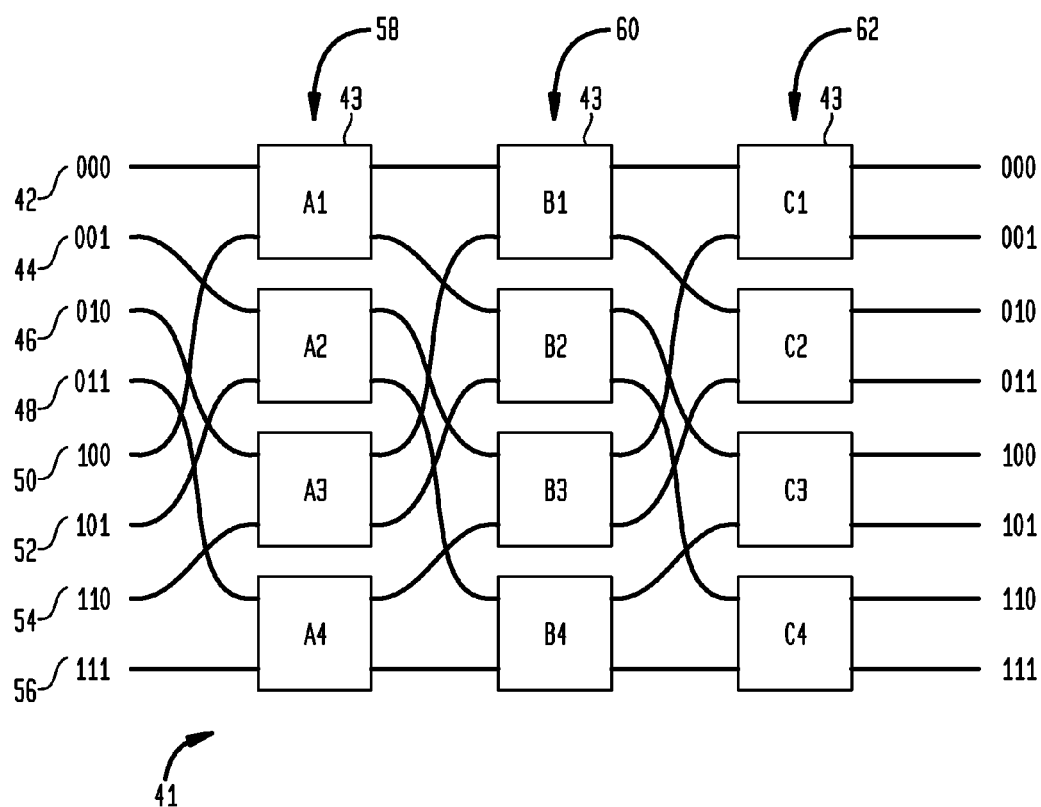
FIG. 4B is a representation of a second embodiment of the Omega network suitable for use with one or more embodiments of the invention.

FIG. 4A shows a first embodiment 40 of an Omega network and FIG. 4B shows a second embodiment 41 of the Omega network. Omega networks are used to implement local interleaving, and include a two-dimensional array of switches, which determines how to route the input samples by programming each switch to be on or off. The configuration of the two-dimensional array is $2^D \times D$, where $2^D$ represents the number of inputs applied to the Omega network input, and D represents the number of stages in the Omega network. Interconnections in the Omega network are similar to a detector trellis, as shown in FIGS. 4A-B. Half of the switches in one stage are independent and programmed randomly. To fully determine the connections of one stage, a $2^{D-1}$-tuple seed (0 or 1) is used and stored in read-only memory (ROM) or random access memory (RAM). To save ROM area, seeds for each stage are obtained by cyclic shifting of one $2^{D-1}$ seed vector. In the 96×96 interleaver circuit 14, the array has a 128×7 configuration with a seed length of 64. In the 48×48 interleaver circuit 12, the array has a 64×6 configuration with a seed length of 32.

Omega networks are used in parallel computing architectures, and represent an indirect topology that relies on a perfect shuffle interconnection algorithm. FIG. 4B shows an Omega network 41 with eight (8) inputs 42-56. The 8×8 Omega network 41 is a multistage interconnection network, which means that the processing elements (PEs) 43 are connected using multiple stages of switches A1-4, B1-4, and C1-4. Inputs and outputs are given addresses 000-111 42-56. The outputs from each of the three (3) stages 58-62 are connected to the inputs of the next stage using a perfect shuffle connection system. This means that the connections at each stage represent the movement of a deck of cards divided into two equal decks and then shuffled together, with each card from one deck alternating with the corresponding card from the other deck. In terms of binary representation of the PEs 43, each stage 58-62 of the perfect shuffle can be thought of as a cyclic logical left shift. Each bit in the address is shifted once to the left, with the most significant bit moving to the least significant bit.

At each stage 58-62, adjacent pairs of inputs are connected to an exchange element or switch A1-4, B1-4, C1-4, which can be set either straight to pass inputs directly through to outputs; or crossed to send an upper input to a lower output, or a lower input to an upper output. For N processing elements, the Omega network includes N/2 switches at each stage, and $\log_2 N$ stages. Thus, in the example shown in FIG. 4B, eight (8) processing elements result in four (4) switches at each stage, and three (3) stages of switches. Configuration of these switches determines the connection paths available in the network at any given time. Two such configurations are destination-tag routing and XOR-tag routing, which are discussed in further detail below. The Omega network is highly blocking, though one path exists from any input to any output in the network.

In destination-tag routing, switch settings are determined by the destination of the message. The most significant bit of the destination address is used to select the output of the switch in the first stage. If the most significant bit is 0, the upper output is selected, and if the most significant bit is 1, the lower output is selected. The next-most significant bit of the destination address is used to select the output of the switch in the next stage, and so on until the final output has been selected.

For example, if the destination of a message is PE 001, the switch settings are upper, upper, and lower. If the destination of a message is PE 101, the switch settings are lower, upper, and lower. These switch settings are applicable regardless of the PE sending the message.

In XOR-tag routing, switch settings are based on a logical combination of the source PE combined with the destination PE using the exclusive or function. This XOR-tag includes 1's in the bit positions that are swapped and 0's in the bit positions that both source and destination have in common. The most significant bit of the XOR-tag is used to select the setting of the switch in the first stage. If the most significant bit is 0, the switch is set to pass-through, and if the most significant bit is 1, the switch is crossed. The next-most significant bit of the tag is used to set the switch in the next stage, and so on until a final output is selected.

For example, if PE 001 is to send a message to PE 010, the XOR-tag will be 011 and the appropriate switch settings are A2 straight, B3 crossed, and C2 crossed. Omega networks are used as connectors between central processing units (CPUs) and shared memory in order to decrease the probability that the CPU-to-memory connection becomes a bottleneck.

Constraints of the read channel will now be discussed. Regarding bypass switches a 128×7 network is used to realize a 96×96 mapping, with a permutation gap of 32. For example, assuming that 96 input samples are taken, the samples are permuted, and 96 samples are generated. However, the Omega network size is $2^x$, and thus the difference between the network size and the size of the actual interleaver circuit being used is referred to as the permutation gap. A 64-by-6 network is used to realize a 48×48 mapping with a permutation gap of 16. That is, the size of the Omega network must be two to the power of some number, but in practice, the system may not have such a quantity of inputs. Thus, to realize a 96×96 mapping, we use a 128×128 Omega network. Among the 128 input connections, 96 are used, and the rest (32) are bypassed.

Bypassed samples can be placed, for example, at the beginning of the network. However, a few inputs at the beginning of the network cannot be permuted, and thus this constraint is addressed by masking out and/or fixing some of the switches, which is due to hardware simplicity. That is, if these inputs at the beginning of the network are permuted, the useful, un bypassed 96 samples will be provided at scattered output ports, which requires that hardware know from which 96 out of the 128 ports to obtain real data. Without any masking, each of the switches in the network is freely programmable. However, if constraints are to be met, some of the switches are fixed to be either on or off depending on the constraint. The embodiments disclosed herein determine which of the switches are to be fixed in order to satisfy the constraints.

Figure 5:
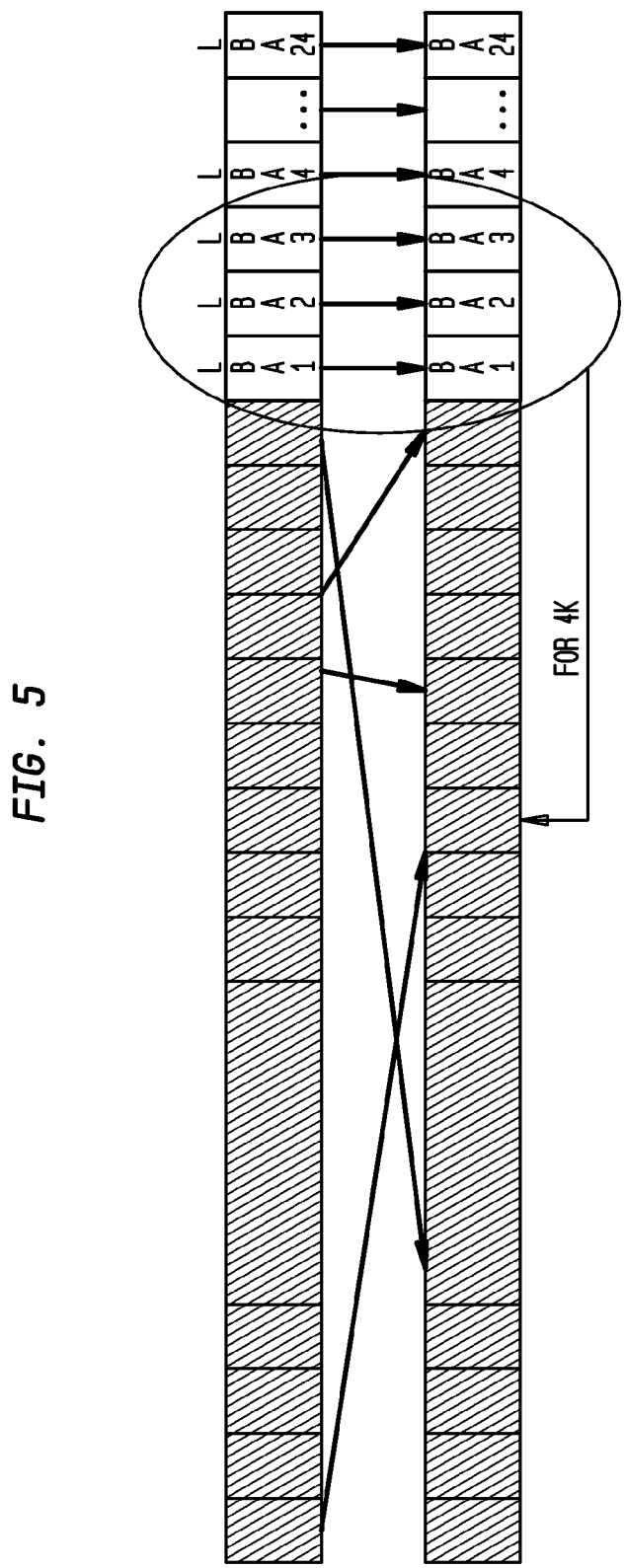
FIG. 5 is an exemplary representation of a read channel constraint addressed by one or more embodiments of the invention disclosed herein.

For the second embodiment shown in FIG. 1C, bypassed samples are arranged at the beginning and middle of the Omega network. When the disclosed circuit for the 4 KB sector (two 48×48 permutations) is used, each 48×48 permutation has 16 samples bypassed, which are arranged at the beginning of the upper or lower half of the network (128/2=64). Thus, when taking the 96×96 network as a whole, the bypassed samples are located at the beginning and the middle. Once this port connectivity is fixed, for hardware simplicity, the 512B sector follows in the same way. In FIG. 5, sixteen bypassed samples are at locations 1-16 and 16 bypassed samples are at locations 65-80.

Logical block addressing (LBA) for the last local interleaving portion is maintained. LBA seeds are included during encoding in the write path, and then dropped and not written onto the hard disk drive. In the read path, the LBA values are passed from the controller to the channel, and inserted before LDPC decoding. The channel inserts the LBA values to the correct position and, for hardware considerations, insertion is handled after the interleaver. Thus, the insertion locations are known after the interleaver. If permutations are chosen in accordance with LBA locations to be bypass (or straight through), the locations to insert the LBA values do not need to be stored. Logical block addressing (LBA) is a scheme used for specifying the location of blocks of data stored in computer storage devices, generally secondary storage systems, such as HDDs. LBA is a linear addressing scheme, in which blocks are located by an integer index, with the first block being LBA 0, the second LBA 1, etc. In logical block addressing, one number is used to address data, and each linear base address describes a single block.

The LBA scheme replaces earlier schemes that expose physical details of the storage device to the software of the operating system. Chief among these is the cylinder head sector (CHS) scheme, in which blocks are addressed by means of a tuple that defines the cylinder, head, and sector at which blocks appeared on the HDD. CHS does not map well to devices other than HDDs, such as tapes and networked storage, and is generally not used for these applications. Disk drives use zone bit recording, in which the number of sectors per track depends on the track number. Even though the HDD reports some CHS values as sectors per track (SPT) and heads per cylinder (HPC), these CHS values have little to do with the true geometry of the HDD.

While the drive controller still addresses data blocks by their CHS address, this information is generally not used by the device driver, the operating system, file system code, or any applications, such as databases that access the raw HDD. In system calls requiring block-level input/output pass LBA definitions to the storage device driver; for simple cases, in which one volume maps to one physical drive, this LBA is passed directly to the drive controller.

LBA symbols are not written onto the disk. Rather, the LBA symbols are forced by the controller. During read back, the controller provides the decoder with the LBA symbol values so that the decoder can simply force the soft information corresponding to these symbols in accordance with what has been provided by the controller. For simplifying LBA symbol forcing in hardware, the last local interleaver includes the LBA symbols, as shown in FIG. 5. In this way, the LBA symbols are guaranteed to reside at the end of the decoder portion. Thus, the hardware is not required to store where the LBA symbols are located, but rather can force them directly. A computer search is used to randomly generate a seed for the last portion and then check if the switching realized by the seed meets LBA interleaving constraints. The result of interleaving one sector is several chunks of 96×96 data permutations. The LBA seeds are only related to the last chunk.

For the second embodiment shown in FIG. 1C, a new constraint is placed on the 4 KB sector, which is that one 96×96 Omega network 14 is used to realize two 48×48 interleaving circuits 12. The advantages of the second embodiment include, but are not limited to, (i) that all constraints are achieved by seed masking, (ii) there is no increase in ROM size, and (iii) there is no performance degradation.

Figure 6A:
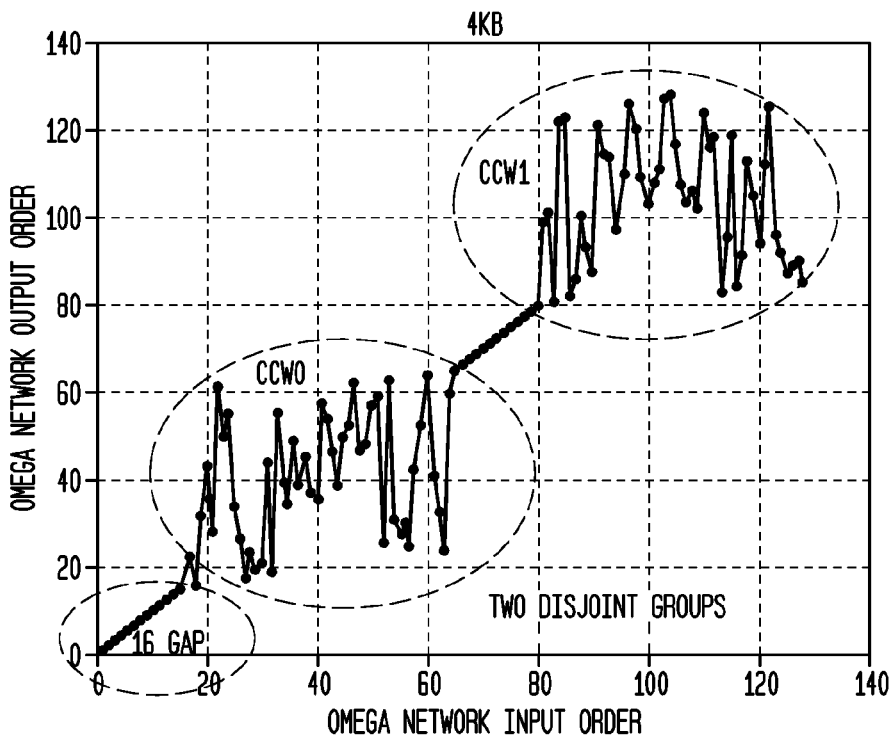
FIGS. 6A-6B are graphical representations of Omega network output order as a function of Omega network input order associated with an illustrative 4 kilobyte sector.
Figure 6B:
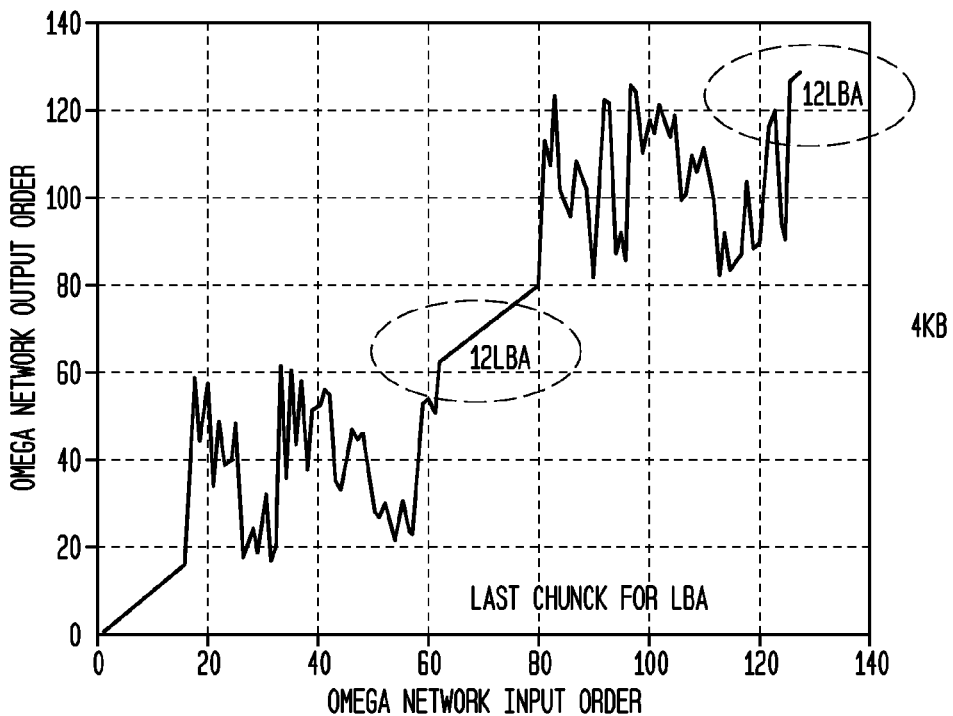
Figure 6C:
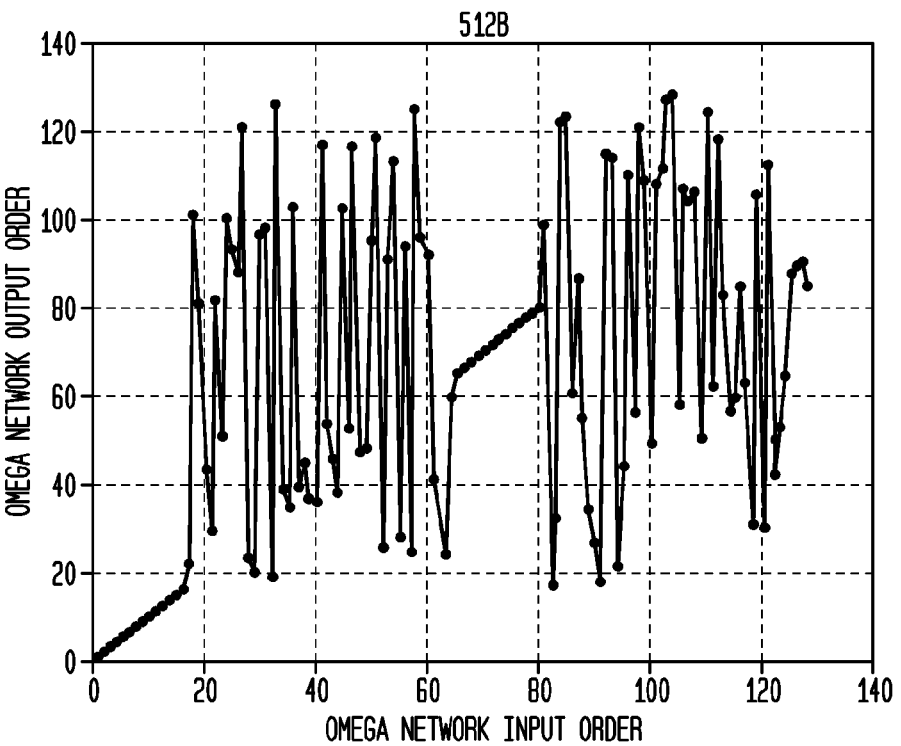
FIGS. 6C-6D are graphical representations of Omega network output order as a function of Omega network input order associated with an illustrative 512 byte sector.
Figure 6D:
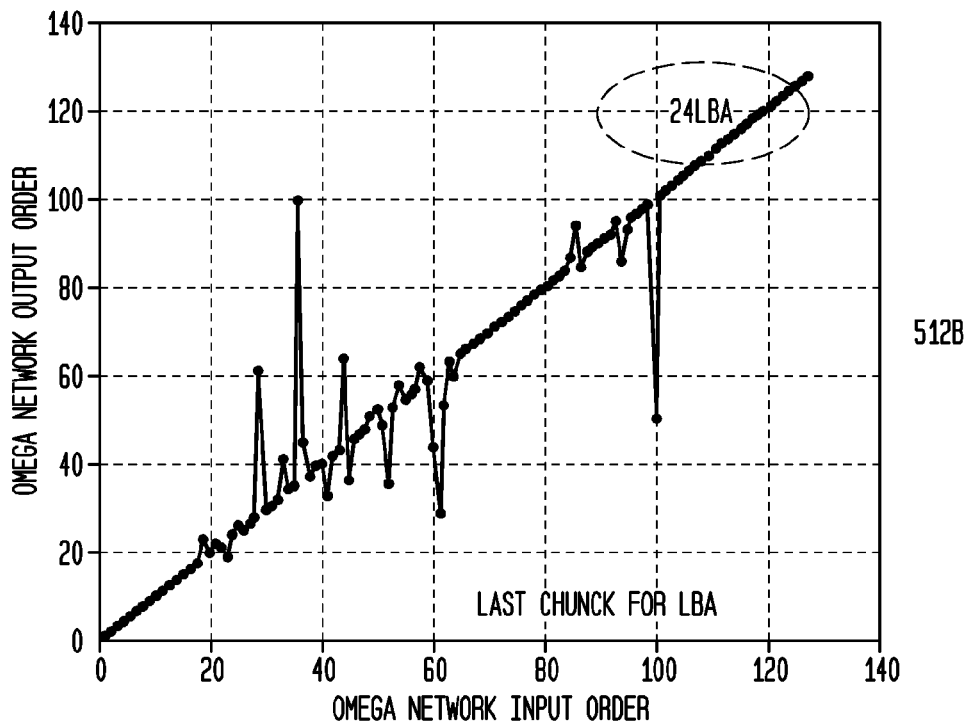

The x-axes in FIGS. 6A-6D represent the input samples, which are labeled as 0-128 in increasing order, and the y-axes show what the sequence becomes after interleaving. The Omega network size considered in FIGS. 6A-6D is 128×128, and the permutation gap is 32. The x-axis is the input index (1-128), and the y-axis is the output index following permutation. FIGS. 6A-6B are directed to the 4 KB sectors, with FIG. 6B directed to the last portion to meet LBA requirements. FIGS. 6C-6D are directed to the 512B sector, with FIG. 6D directed to the last portion to meet LBA requirements.

Figure 7A:
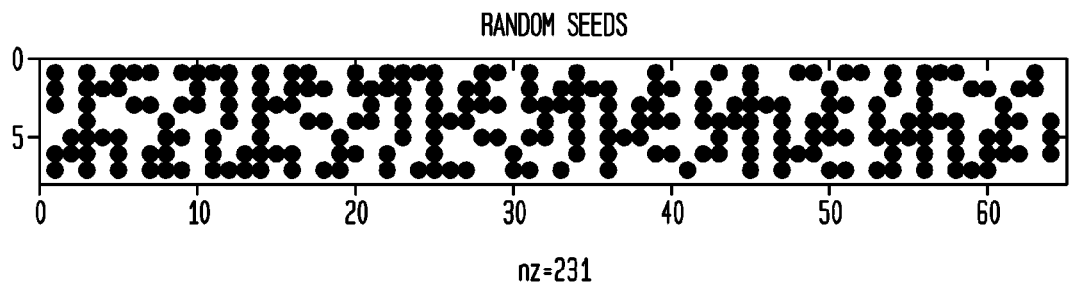
FIGS. 7A-7C are graphical representations of read channel constraint realization using control seed masking.
Figure 7B:
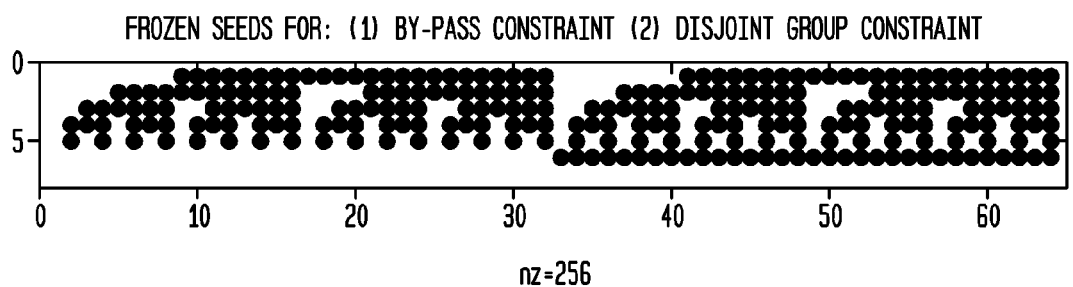
Figure 7C:
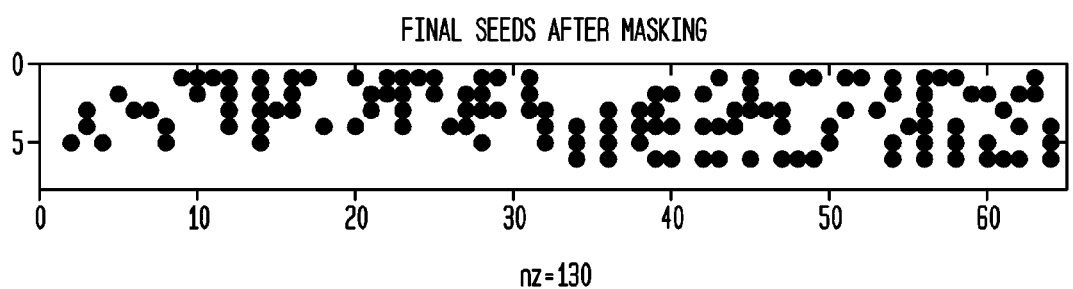

FIG. 7A shows random seed values, in which each row corresponds to seeds of one stage of the Omega network. Each dot in FIG. 7A represents a "1," which indicates that the corresponding switch is set to be on. There are seven rows, and thus seven stages. FIG. 7B illustrates two-dimensional masking. Each dot in FIG. 7B represents a "1," which means that the corresponding switch is set to be on and will be controlled by the seed. The absence of a dot or a "0" represents that the corresponding switch will be turned off regardless of what the random seed indicates. FIG. 7C illustrates the result of multiplying the contents of FIG. 7A with the contents of FIG. 7B, in a location-by-location manner.

As will be appreciated by one skilled in the art, aspects of the embodiments disclosed herein may be embodied as a system, method, or computer program product. Accordingly, these embodiments may take the form of an entirely hardware embodiment, an entirely software embodiment (including firmware, resident software, micro-code, and the like) or an embodiment combining software and hardware aspects that may all generally be referred to herein as a "circuit," "module" or "system." Furthermore, at least a portion of these embodiments may take the form of a computer program product embodied in one or more computer readable medium(s) having computer readable program code embodied thereon.

One or more embodiments, or elements thereof, can be implemented in the form of an apparatus including a storage device or memory and at least one processing device or processor that is coupled to the memory and operative to perform a method according to one or more embodiments.

One or more embodiments disclosed herein, or a portion thereof, make use of software running on a general purpose computer or workstation. By way of example only and without limitation, FIG. 8 is a block diagram of an embodiment of a machine in the form of a computing system 200, within which is a set of instructions 202 that, when executed, cause the machine to perform any one or more of the methodologies according to embodiments of the invention. In one or more embodiments, the machine operates as a standalone device; in one or more other embodiments, the machine is connected (e.g., via a network 222) to other machines. In a networked implementation, the machine operates in the capacity of a server or a client user machine in a server-client user network environment. Exemplary implementations of the machine as contemplated by embodiments of the invention include, but are not limited to, a server computer, client user computer, personal computer (PC), tablet PC, personal digital assistant (PDA), cellular telephone, mobile device, palmtop computer, laptop computer, desktop computer, communication device, personal trusted device, web appliance, network router, switch or bridge, or any machine capable of executing a set of instructions (sequential or otherwise) that specify actions to be taken by that machine.

The computing system 200 includes a processing device(s) 204 (e.g., a central processing unit (CPU), a graphics processing unit (GPU), or both), program memory device(s) 206, and data memory device(s) 208, which communicate with each other via a bus 210. The computing system 200 further includes display device(s) 212 (e.g., liquid crystals display (LCD), flat panel, solid state display, or cathode ray tube (CRT)). The computing system 200 includes input device(s) 214 (e.g., a keyboard), cursor control device(s) 216 (e.g., a mouse), disk drive unit(s) 218, signal generation device(s) 220 (e.g., a speaker or remote control), and network interface device(s) 224, operatively coupled together, and/or with other functional blocks, via bus 210.

The disk drive unit(s) 218 includes machine-readable medium(s) 226, on which is stored one or more sets of instructions 202 (e.g., software) embodying any one or more of the methodologies or functions herein, including those methods illustrated herein. The instructions 202 may also reside, completely or at least partially, within the program memory device(s) 206, the data memory device(s) 208, and/or the processing device(s) 204 during execution thereof by the computing system 200. The program memory device(s) 206 and the processing device(s) 204 also constitute machine-readable media. Dedicated hardware implementations, such as but not limited to ASICs, programmable logic arrays, and other hardware devices can likewise be constructed to implement methods described herein. Applications that include the apparatus and systems of various embodiments broadly comprise a variety of electronic and computer systems. Some embodiments implement functions in two or more specific interconnected hardware modules or devices with related control and data signals communicated between and through the modules, or as portions of an ASIC. Thus, the example system is applicable to software, firmware, and/or hardware implementations.

The term "processing device" as used herein is intended to include any processor, such as, for example, one that includes a CPU (central processing unit) and/or other forms of processing circuitry. Further, the term "processing device" may refer to more than one individual processor. The term "memory" is intended to include memory associated with a processor or CPU, such as, for example, RAM (random access memory), ROM (read only memory), a fixed memory device (for example, hard drive), a removable memory device (for example, diskette), a flash memory and the like. In addition, the display device(s) 212, input device(s) 214, cursor control device(s) 216, signal generation device(s) 220, etc., can be collectively referred to as an "input/output interface," and is intended to include one or more mechanisms for inputting data to the processing device(s) 204, and one or more mechanisms for providing results associated with the processing device(s). Input/output or I/O devices (including but not limited to keyboards (e.g., alpha-numeric input device(s) 214, display device(s) 212, and the like) can be coupled to the system either directly (such as via bus 210) or through intervening input/output controllers (omitted for clarity).

In an integrated circuit implementation of one or more embodiments of the invention, multiple identical die are typically fabricated in a repeated pattern on a surface of a semiconductor wafer. Each such die may include a device described herein, and may include other structures and/or circuits. The individual dies are cut or diced from the wafer, then packaged as integrated circuits. One skilled in the art would know how to dice wafers and package die to produce integrated circuits. Any of the exemplary circuits or method illustrated in the accompanying figures, or portions thereof, may be part of an integrated circuit. Integrated circuits so manufactured are considered part of this invention.

An integrated circuit in accordance with the embodiments of the present invention can be employed in essentially any application and/or electronic system in which buffers are utilized. Suitable systems for implementing one or more embodiments of the invention include, but are not limited, to personal computers, interface devices (e.g., interface networks, high-speed memory interfaces (e.g., DDR3, DDR4), etc.), data storage systems (e.g., RAID system), data servers, etc. Systems incorporating such integrated circuits are considered part of embodiments of the invention. Given the teachings provided herein, one of ordinary skill in the art will be able to contemplate other implementations and applications.

In accordance with various embodiments, the methods, functions or logic described herein is implemented as one or more software programs running on a computer processor. Dedicated hardware implementations including, but not limited to, application specific integrated circuits, programmable logic arrays and other hardware devices can likewise be constructed to implement the methods described herein. Further, alternative software implementations including, but not limited to, distributed processing or component/object distributed processing, parallel processing, or virtual machine processing can also be constructed to implement the methods, functions or logic described herein.

The embodiment contemplates a machine-readable medium or computer-readable medium containing instructions 202, or that which receives and executes instructions 202 from a propagated signal so that a device connected to a network environment 222 can send or receive voice, video or data, and to communicate over the network 222 using the instructions 202. The instructions 202 are further transmitted or received over the network 222 via the network interface device(s) 224. The machine-readable medium also contains a data structure for storing data useful in providing a functional relationship between the data and a machine or computer in an illustrative embodiment of the systems and methods herein.

While the machine-readable medium 202 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding, or carrying a set of instructions for execution by the machine and that cause the machine to perform anyone or more of the methodologies of the embodiment. The term "machine-readable medium" shall accordingly be taken to include, but not be limited to: solid-state memory (e.g., solid-state drive (SSD), flash memory, etc.); read-only memory (ROM), or other non-volatile memory; random access memory (RAM), or other re-writable (volatile) memory; magneto-optical or optical medium, such as a disk or tape; and/or a digital file attachment to e-mail or other self-contained information archive or set of archives is considered a distribution medium equivalent to a tangible storage medium. Accordingly, the embodiment is considered to include anyone or more of a tangible machine-readable medium or a tangible distribution medium, as listed herein and including art-recognized equivalents and successor media, in which the software implementations herein are stored.

It should also be noted that software, which implements the methods, functions and/or logic herein, are optionally stored on a tangible storage medium, such as: a magnetic medium, such as a disk or tape; a magneto-optical or optical medium, such as a disk; or a solid state medium, such as a memory card or other package that houses one or more read-only (non-volatile) memories, random access memories, or other re-writable (volatile) memories. A digital file attachment to e-mail or other self-contained information archive or set of archives is considered a distribution medium equivalent to a tangible storage medium. Accordingly, the disclosure is considered to include a tangible storage medium or distribution medium as listed herein and other equivalents and successor media, in which the software implementations herein are stored.

As previously stated, although the specification describes components and functions implemented in accordance with embodiments of the invention with reference to particular standards and protocols, the embodiments are not limited to such standards and protocols.

The illustrations of embodiments of the invention described herein are intended to provide a general understanding of the structure of various embodiments, and they are not intended to serve as a complete description of all the elements and features of apparatus and systems that might make use of the structures described herein. Many other embodiments will become apparent to those skilled in the art given the teachings herein; other embodiments are utilized and derived therefrom, such that structural and logical substitutions and changes can be made without departing from the scope of this disclosure. The drawings are also merely representational and are not drawn to scale. Accordingly, the specification and drawings are to be regarded in an illustrative rather than a restrictive sense.

Embodiments of the invention are referred to herein, individually and/or collectively, by the term "embodiment" merely for convenience and without intending to limit the scope of this application to any single embodiment or inventive concept if more than one is, in fact, shown. Thus, although specific embodiments have been illustrated and described herein, it should be understood that an arrangement achieving the same purpose can be substituted for the specific embodiment(s) shown; that is, this disclosure is intended to cover any and all adaptations or variations of various embodiments. Combinations of the above embodiments, and other embodiments not specifically described herein, will become apparent to those of skill in the art given the teachings herein.

In the foregoing description of the embodiments, various features are grouped together in a single embodiment for the purpose of streamlining the disclosure. This method of disclosure is not to be interpreted as reflecting that the claimed embodiments have more features than are expressly recited in each claim. Rather, as the following claims reflect, inventive subject matter lies in less than all features of a single embodiment. Thus the following claims are hereby incorporated into the Detailed Description, with each claim standing on its own as a separate example embodiment.

The abstract is provided to comply with 37 C.F.R. §1.72(b), which requires an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the appended claims reflect, inventive subject matter lies in less than all features of a single embodiment. Thus the following claims are hereby incorporated into the Detailed Description, with each claim standing on its own as separately claimed subject matter.

Given the teachings of the invention provided herein, one of ordinary skill in the art will be able to contemplate other implementations and applications of the techniques of the invention. Although illustrative embodiments of the invention have been described herein with reference to the accompanying drawings, it is to be understood that the invention is not limited to those precise embodiments, and that various other changes and modifications are made therein by one skilled in the art without departing from the scope of the appended claims.

What is claimed is:

1. A memory interleaving apparatus, comprising:
a first interleaver, the first interleaver being associated with a first sector size, the first interleaver selectively interleaving information stored in a first memory in response to a sector select signal, the first memory being associated with the first sector size;
a second interleaver, the second interleaver being associated with a second sector size, the second interleaver selectively interleaving information stored in a second memory in response to the sector select signal, the second memory being associated with the second sector size, the first interleaver being coupled with the second interleaver.

2. The memory interleaving apparatus as defined by claim 1, wherein at least one of the first interleaver and the second interleaver comprises an Omega network.

3. The memory interleaving apparatus as defined by claim 1, further comprising scratch pad memory coupled with at least one of the first interleaver and the second interleaver.

4. The memory interleaving apparatus as defined by claim 1, further comprising a multiplexer coupled with the first interleaver and adapted to receive the sector select signal, the multiplexer being coupled with at least one of the first memory and the second memory.

5. The memory interleaving apparatus as defined by claim 1, wherein the first interleaver comprises a plurality of stages and the second interleaver comprises a single stage.

6. The memory interleaving apparatus as defined by claim 1, wherein the first interleaver is configured as a 48×48 mapping, the second interleaver is configured as a 96×96 mapping, the first sector size is configured having 4 kilobytes, and the second sector size is configured having 512 bytes.

7. The memory interleaving apparatus as defined by claim 1, wherein at least a portion of the memory interleaving apparatus is formed in an integrated circuit.

8. A memory interleaving system, comprising:
an interleaver, the interleaver being associated with a first sector size and a second sector size, the interleaver selectively interleaving information stored in at least one of a first memory and a second memory in response to a sector select signal, the first memory being associated with the first sector size, the second memory being associated with the second sector size; and
a storage device operatively coupled to the interleaver, the storage device storing a first masking seed associated with the first sector size, the storage device storing a second masking seed associated with a second sector size, the storage device selectively providing at least one of the first masking seed and the second masking seed to the interleaver in response to the sector select signal.

9. The memory interleaving system as defined by claim 8, wherein the interleaver comprises an Omega network.

10. The memory interleaving system as defined by claim 8, further comprising scratch pad memory coupled with the interleaver.

11. The memory interleaving system as defined by claim 8, further comprising a multiplexer coupled with the interleaver and adapted to receive the sector select signal, the multiplexer being coupled with at least one of the first memory and the second memory.

12. The memory interleaving system as defined by claim 8, wherein the interleaver comprises a plurality of stages.

13. A method of interleaving memory, comprising:
coupling a first interleaver operatively with a second interleaver;
interleaving, by the first interleaver, information stored in a first memory selectively in response to a sector select signal, the first interleaver being associated with a first sector size, the first memory being associated with the first sector size; and
interleaving, by the second interleaver, information stored in a second memory selectively in response to the sector select signal, the second interleaver being associated with a second sector size, the second memory being associated with the second sector size.

14. The method as defined by claim 13, further comprising configuring at least one of the first interleaver and the second interleaver as an Omega network.

15. The method as defined by claim 13, further comprising coupling scratch pad memory with at least one of the first interleaver and the second interleaver.

16. The method as defined by claim 13, further comprising:
coupling a multiplexer with the first interleaver and the sector select signal; and
coupling the multiplexer with at least one of the first memory and the second memory.

17. The method as defined by claim 13, further comprising:
configuring the first interleaver as a plurality of stages; and
configuring the second interleaver as a single stage.

18. The method as defined by claim 13, further comprising:
configuring the first interleaver as a 48×48 mapping;
configuring the second interleaver as a 96×96 mapping;
configuring the first sector size as 4 kilobytes; and
configuring the second sector size as 512 bytes.

19. A method of interleaving memory, comprising:
interleaving, by an interleaver, information stored in at least one of a first memory and a second memory selectively in response to a sector select signal, the interleaver being associated with a first sector size and a second sector size, the first memory being associated with the first sector size, the second memory being associated with the second sector size; and
providing, by a storage device, at least one of a first masking seed and a second masking seed to the interleaver selectively in response to the sector select signal, the first masking seed being associated with the first sector size, the second masking seed being associated with a second sector size.

20. The memory interleaving system as defined by claim 19, further comprising configuring the interleaver as an Omega network.

21. The memory interleaving system as defined by claim 19, further comprising coupling scratch pad memory with the interleaver.

22. The memory interleaving system, as defined by claim 19, further comprising:
coupling a multiplexer with the interleaver and the sector select signal; and
coupling the multiplexer with at least one of the first memory and the second memory.

23. The memory interleaving system, as defined by claim 19, further comprising configuring the interleaver as a plurality of stages.

* * * * *